United States Patent [19]

Kaufman

[11] Patent Number: 5,032,691
[45] Date of Patent: Jul. 16, 1991

[54] ELECTRIC CIRCUIT ASSEMBLY WITH VOLTAGE ISOLATION

[76] Inventor: Lance R. Kaufman, 7345 E. Acoma, Scottsdale, Ariz. 85260

[21] Appl. No.: 469,350

[22] Filed: Jan. 24, 1990

Related U.S. Application Data

[63] Continuation-in-part of Ser. No. 180,476, Apr. 12, 1988, Pat. No. 4,902,854.

[51] Int. Cl.⁵ .................. H01L 23/02; H01L 23/48
[52] U.S. Cl. ............................ 174/52.4; 357/70; 357/74
[58] Field of Search .............. 174/52.4, 52.3, 52.2; 357/70, 74

[56] References Cited

U.S. PATENT DOCUMENTS

| | | |
|---|---|---|
| 3,744,120 | 7/1973 | Burgess et al. . |
| 3,766,634 | 10/1973 | Babcock et al. . |
| 3,854,892 | 12/1974 | Burgess et al. . |
| 3,911,553 | 10/1975 | Burgess et al. . |
| 3,958,075 | 5/1976 | Kaufman . |
| 3,993,411 | 11/1976 | Babcock et al. . |
| 3,994,430 | 11/1976 | Cusano et al. . |
| 4,012,579 | 3/1977 | Fox et al. ............ 174/52.2 |
| 4,129,243 | 12/1978 | Cusano et al. . |
| 4,156,148 | 5/1979 | Kaufman . |
| 4,196,411 | 4/1980 | Kaufman . |
| 4,215,235 | 7/1980 | Kaufman . |
| 4,218,724 | 8/1980 | Kaufman . |
| 4,250,481 | 2/1981 | Kaufman . |
| 4,266,140 | 5/1981 | Kaufman . |
| 4,394,530 | 7/1983 | Kaufman . |
| 4,449,165 | 5/1984 | Kaufman . |
| 4,449,292 | 5/1984 | Kaufman . |
| 4,488,202 | 12/1984 | Kaufman . |
| 4,498,120 | 2/1985 | Kaufman . |
| 4,546,410 | 10/1985 | Kaufman . |
| 4,546,411 | 10/1985 | Kaufman . |
| 4,554,613 | 11/1985 | Kaufman . |
| 4,574,162 | 3/1986 | Kaufman . |
| 4,577,387 | 3/1986 | Kaufman . |
| 4,630,174 | 12/1986 | Kaufman . |
| 4,700,273 | 10/1987 | Kaufman . |
| 4,713,723 | 12/1987 | Kaufman . |
| 4,724,514 | 2/1988 | Kaufman . |
| 4,736,520 | 4/1988 | Morris . |
| 4,739,449 | 4/1988 | Kaufman . |
| 4,779,060 | 10/1988 | Henden . |
| 4,788,765 | 12/1988 | Kaufman et al. . |
| 4,818,895 | 4/1989 | Kaufman . |
| 4,819,042 | 4/1989 | Kaufman . |
| 4,831,723 | 5/1989 | Kaufman . |
| 4,879,633 | 11/1989 | Kaufman . |

OTHER PUBLICATIONS

"Over 50 years of experience with the Direct Bond Copper process", Tegmen Corp., 1201 East Fayette Street, Syracuse, New York 13210.

Primary Examiner—Leo P. Picard
Assistant Examiner—Bot L. Ledynh
Attorney, Agent, or Firm—Andrus, Sceales, Starke & Sawall

[57] ABSTRACT

An electric circuit assembly (212) includes a ceramic tub (214) having a substrate floor (216) and an integral side wall (218) around the perimeter thereof and extending upwardly therefrom and having an integral lower wall (270) extending downwardly therefrom. The lower wall (270) is multi-partitioned and includes dividing wall portions (286, 288) providing electrical isolation and preventing sparking or voltage crossover between lead frames (220, 222, 224). The lower multi-partitioned wall also includes an outer peripheral portion (290) generally defining a chamber between the substrate (216) and a lower substrate (226) and enclosing the space between the substrates and encompassing recesses (274, 276, 278) defined in the lower surface of the upper substrate by central inner partitioned wall portions (286, 288, 292, 294). Copper lead frames (220, 222, 224) have pad portions (220a, 222a, 224a), received in respective recesses below respective apertures (240, 242, 244) through the upper substrate (216). A semiconductor chip (238) is connected to the lead frames through the apertures in the substrate.

31 Claims, 7 Drawing Sheets

ELECTRIC CIRCUIT ASSEMBLY WITH VOLTAGE ISOLATION

CROSS REFERENCE TO RELATED APPLICATION

This application is a continuation in part of application Ser. No. 07/180,476, filed Apr. 12, 1988 U.S. Pat. No. 4,902,854.

BACKGROUND AND SUMMARY

The present invention arose out of continuing development efforts in the noted parent application. The invention provides voltage isolation of lead frames in electric circuit assemblies, including direct bond circuit assemblies of the parent application.

Electric circuit assemblies in the field of the present invention typically include an electrically insulating thermally conductive non-metallic refractory substrate, e.g. ceramic, having electrically conductive metallic lead frames, e.g. copper, mounted on the substrate, and electric components, e.g semiconductor chips, mounted on the lead frames. The structure is covered by an insulating housing which in turn is mounted to a heat sink such that the bottom surface of the ceramic substrate is in intimate contact with the heat sink. Examples of such circuit assemblies are noted in the parent application.

The copper lead frames are mounted to the ceramic in various manners, for example by a solder reflow operation, or by a direct bond operation, both of which processes are known in the art.

Direct bonding of the copper to the ceramic involves placing the lead frame in contact with the ceramic, heating the lead frame and the ceramic substrate to a temperature below the melting point of the lead frame to form a eutectic with the lead frame which wets the lead frame and the ceramic substrate, and cooling the lead frame and the substrate with the lead frame bonded to the substrate. The lead frame is pre-oxidized, and the heating is done in an inert atmosphere, or alternatively the heating is done in a reactive oxygen gas atmosphere. Examples of the direct bond process are noted in the parent application.

The present invention arose from efforts relating to a hermetic sealed circuit package with direct bond processing, though the invention has broader application.

BRIEF DESCRIPTION OF THE DRAWINGS

Parent Application

Present Invention

Figure 11:
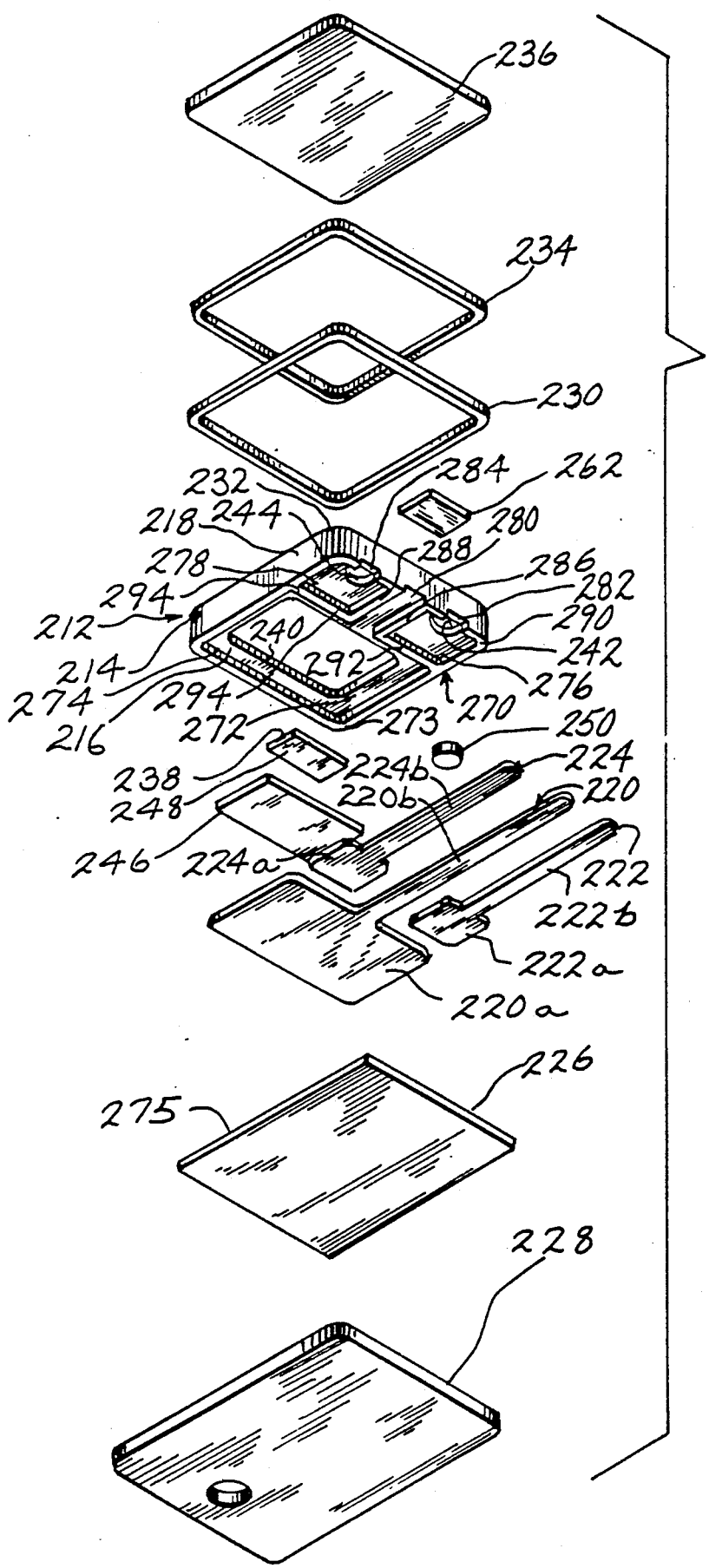

FIG. 11 is an exploded perspective view of an electric circuit assembly in accordance with the present invention.

Figure 12:
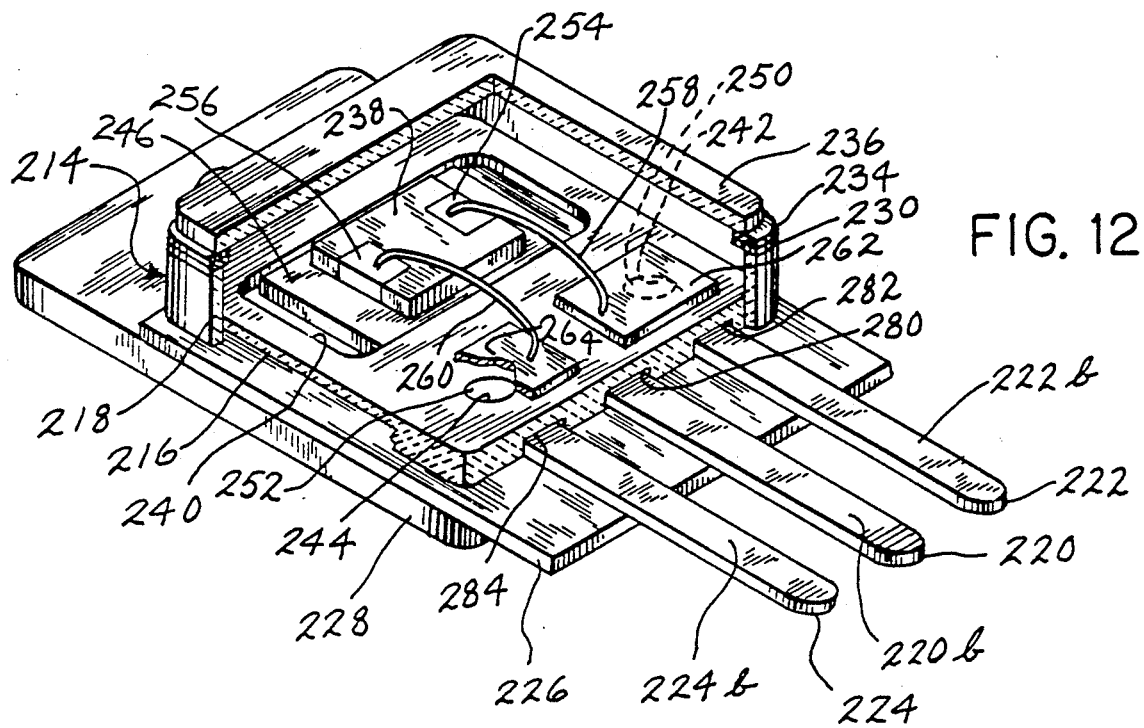

FIG. 12 is an assembled view of the structure of FIG. 11, partially cut away.

Figure 13:
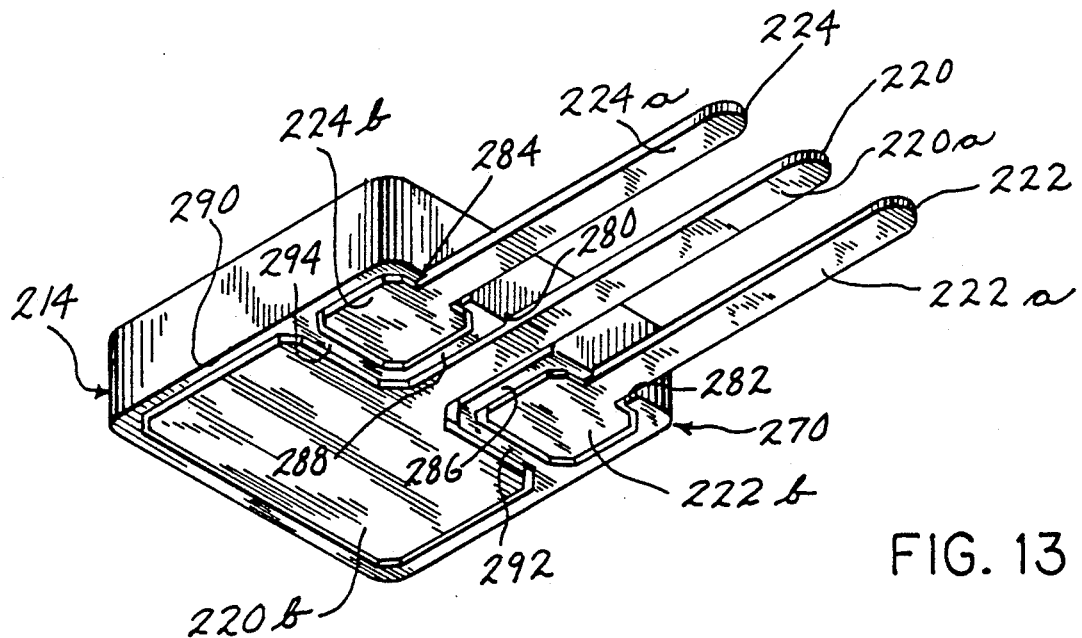

FIG. 13 is a view from below of a portion of the structure of FIG. 12.

Figure 14:
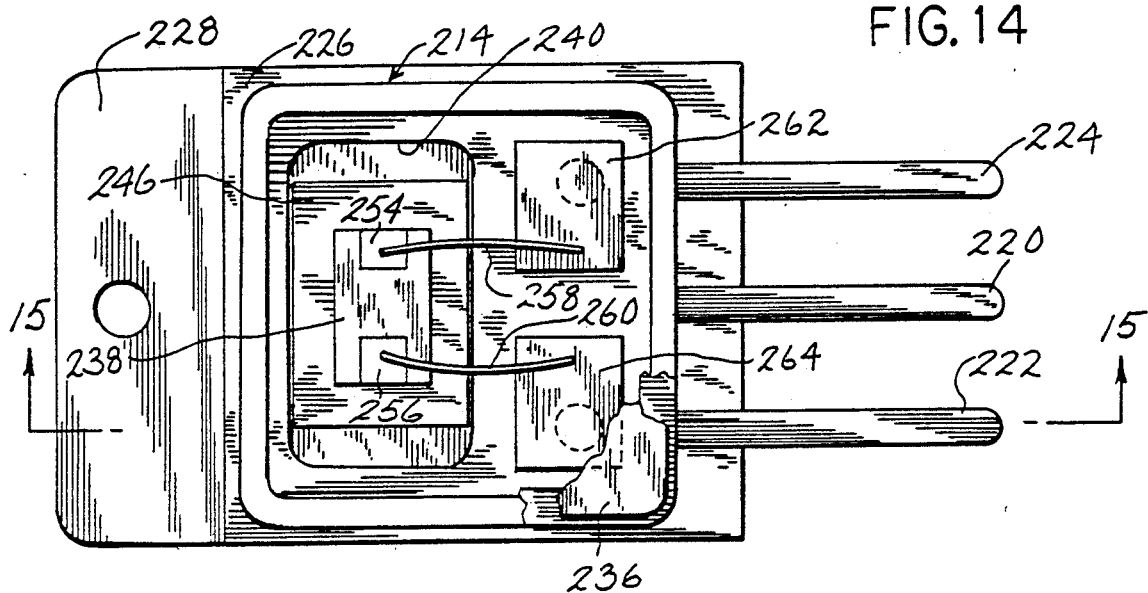

FIG. 14 is a top view of the structure of FIG. 12, partially cut away.

Figure 15:
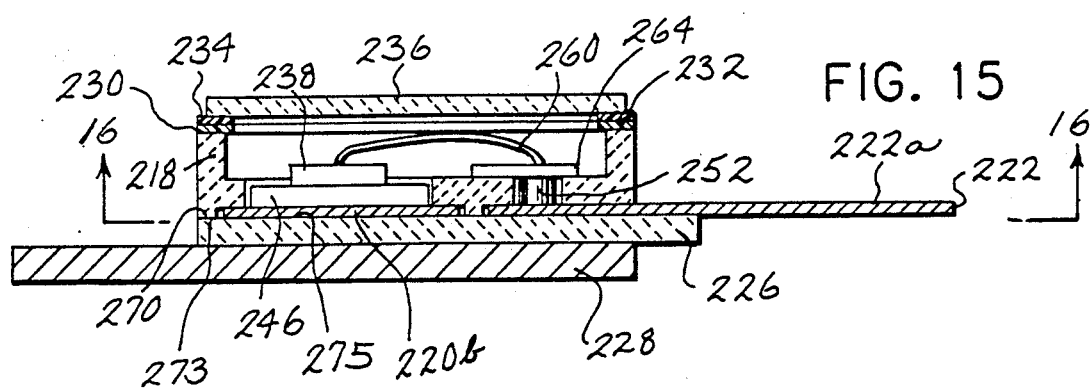

FIG. 15 is a sectional view taken along line 15—15 of FIG. 14.

Figure 16:
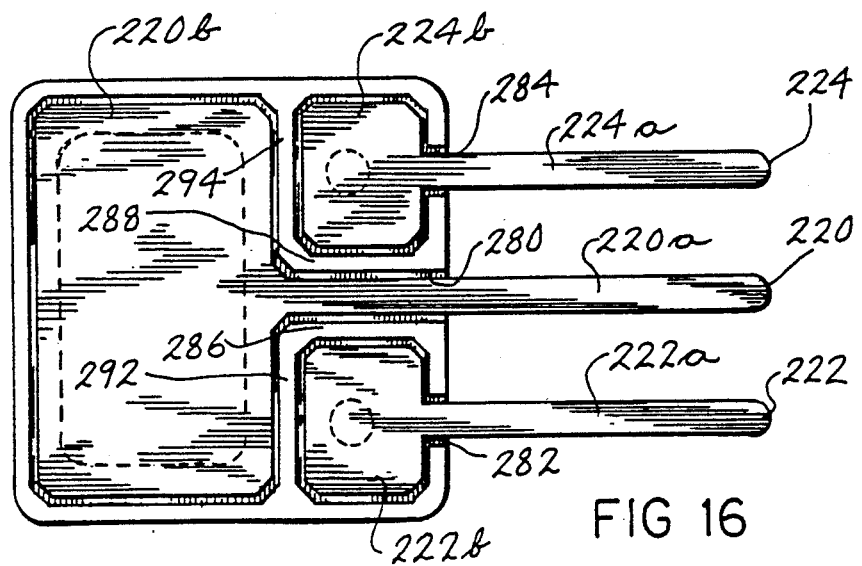

FIG. 16 is a bottom view of a portion of the structure of FIG. 14.

DETAILED DESCRIPTION

Parent Application

Figure 1:
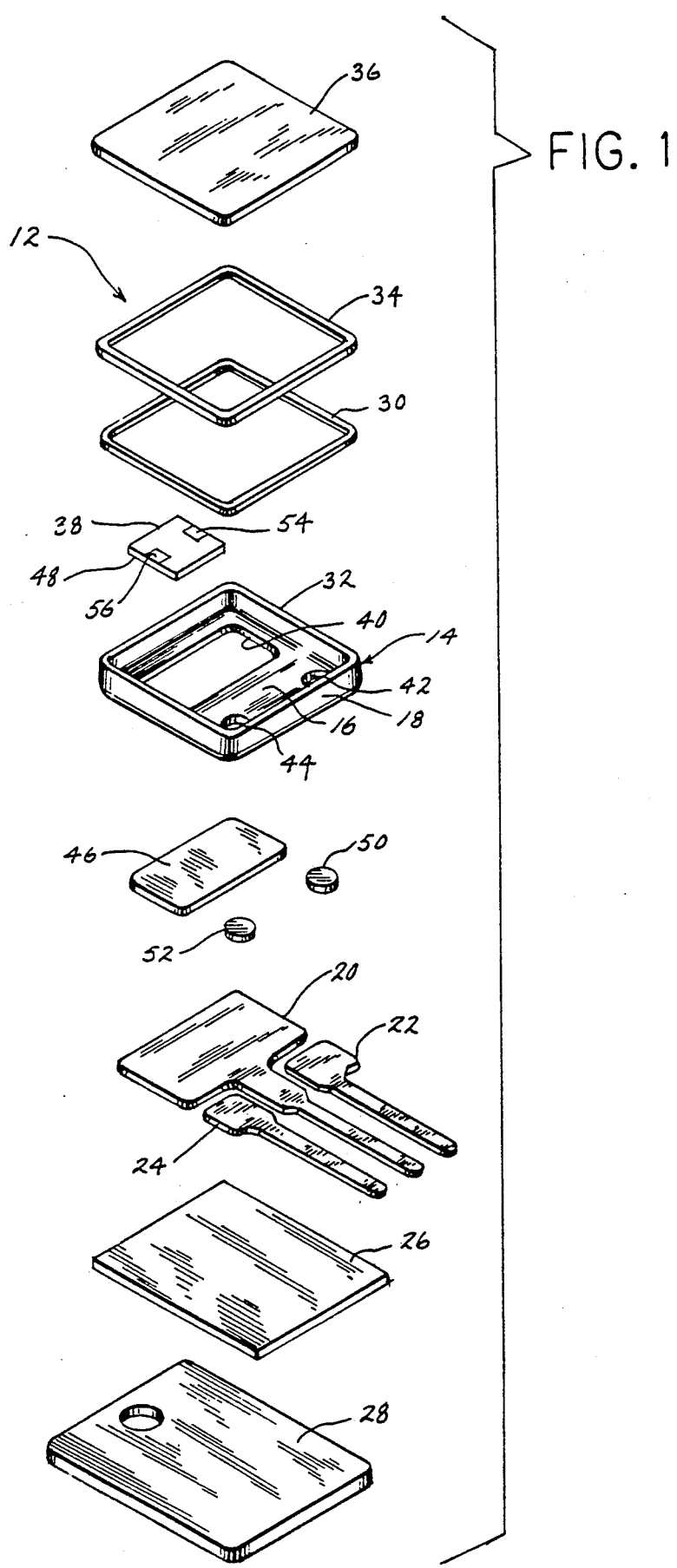
FIG. 1 is an exploded perspective view of an electric circuit assembly in accordance with the invention of the parent application.
Figure 2:
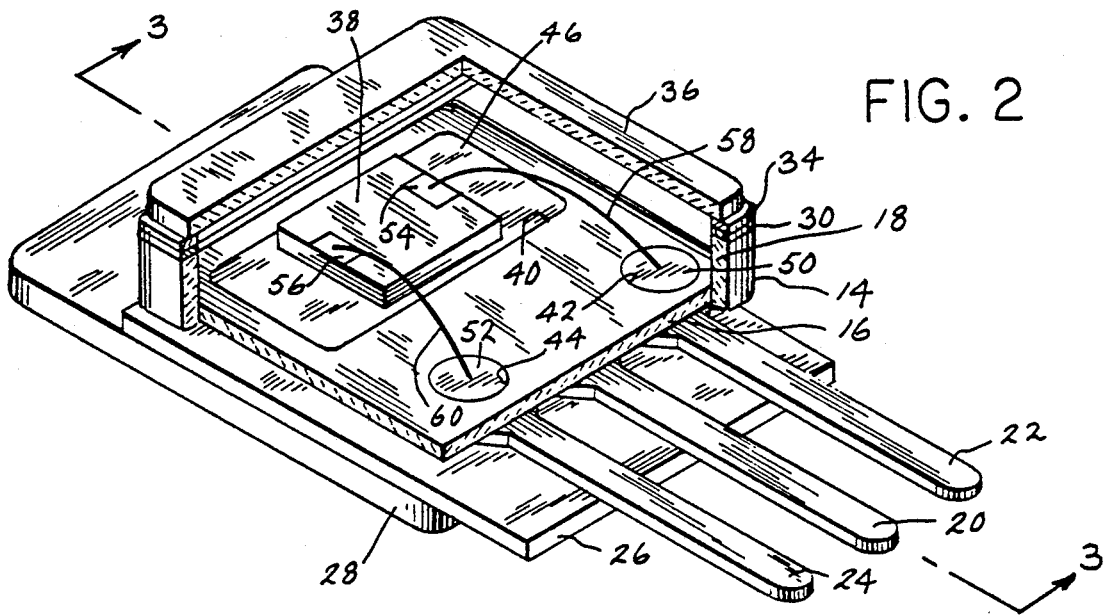
FIG. 2 is an assembled view of the structure of FIG. 1, partially cut away.
Figure 3:
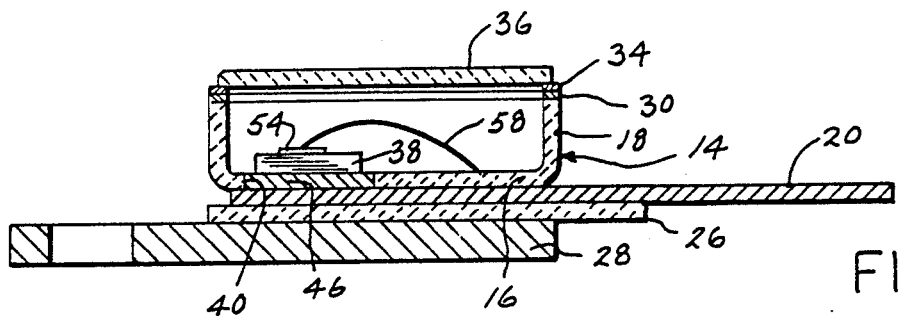
FIG. 3 is a sectional view taken along line 3—3 of FIG. 2.

FIGS. 1-3 show an electric circuit assembly 12. An electrically insulating refractory ceramic tub 14 has a floor 16 and an integral side wall 18 around the perimeter thereof and extending upwardly therefrom. Tub 14 is placed in contact with electrically conductive copper lead frames 20, 22, 24 therebelow, which in turn are placed in contact with electrically insulating refractory ceramic substrate 26 therebelow, which in turn is placed in contact with electrically conductive copper base plate 28 therebelow. A copper ring 30 is placed in contact with the top 32 of side wall 18 of tub 14. A second copper ring 34 is placed in contact with the underside of an electrically insulating refractory ceramic top cover 36.

The assemblies are then directly and hermetically bonded. Copper ring 30, ceramic tub 14, copper lead frames 20, 22, 24, ceramic substrate 26, and copper base plate 28 are placed in the noted contact and heated to a temperature below the melting point of copper ring 30, copper lead frames 20, 22, 24, and copper base plate 28 to form a eutectic with the copper which wets such copper members and the noted ceramic members in contact therewith. The assembly is then cooled, with copper ring 30 bonded to the top 32 of side wall 18 of tub 14 therebelow, and with lead frames 20, 22, 24 bonded to the bottom of floor 16 of tub 14 thereabove, and with lead frames 20, 22, 24 bonded to the top of ceramic substrate 26 therebelow, and with copper base plate 28 bonded to the bottom of ceramic substrate 26 thereabove. The copper members are pre-oxidized, and the assembly is heated in an inert atmosphere, or alternately the assembly is heated in a reactive oxidation atmosphere. For further reference to the direct bonding process, reference is made to the above noted direct bond process patents, incorporated herein by reference. Copper ring 34 is directly and hermetically bonded to the underside of ceramic top cover 36 in like manner. An electrical component provided by semiconductor chip 38 is then mounted in the tub and connected to the lead frames. The top cover 36 is hermetically sealed to the top of the side wall of the tub, by welding rings 30 and 34 to each other.

Tub 14 sits on lead frames 20, 22, 24 with the bottom of floor 16 bonded to the top of the lead frames. Floor 16 has a plurality of apertures 40, 42, 44, therethrough. Semiconductor chip 38 is connected to the lead frames through the apertures. Lead frame 20 has a portion 46 extending upwardly in aperture 40. Portion 46 may be formed by half-etching lead frame 20, for example as shown in U.S. Pat. 4,630,174, or portion 46 may be soldered or welded to lead frame 20 and/or directly bonded to the sides of aperture 40. Semiconductor chip 38 has a lower contact pad 48 mounted on portion 46 by solder reflow and in electrical contact with portion 46. Lead frames 22 and 24 have portions 50 and 52 extending upwardly in respective apertures 42 and 44 which likewise may be formed by half-etching, or may be separate pieces welded or soldered to the rest of the lead frame therebelow and/or directly bonded to the sides of the apertures. Semiconductor chip 38 has a pair of upper contact pads 54 and 56 connected by sonically or thermally welded respective jumper leads 58 and 60 to lead frame portions 50 and 52. In the case of a FET chip, lower contact pad 48 is the drain, and upper contact pads 54 and 56 are the source and gate.

Figure 4:
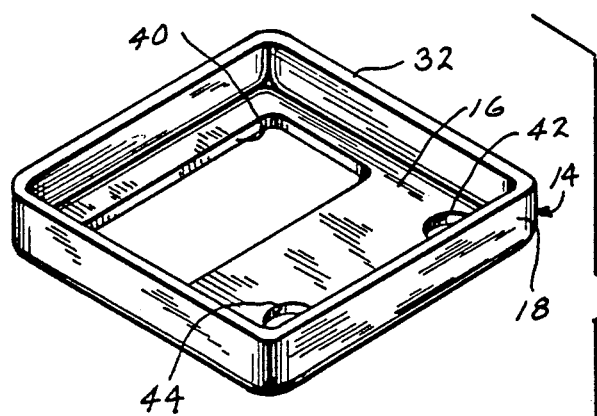
FIG. 4 is an exploded perspective view of an alternate embodiment of a portion of FIG. 1
Figure 4:
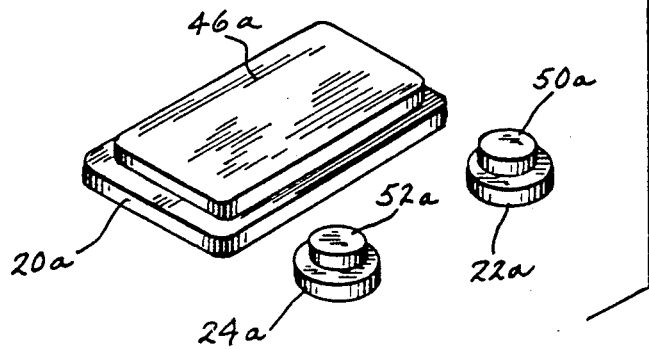

FIG. 4 shows an alternate embodiment for a surface mount configuration, without lower ceramic substrate 26 and copper base plate 28. Modified lead frames 20a, 22a, 24a, correspond respectively to lead frames 20, 22, 24, and have respective integral portions 46a, 50a, 52a extending upwardly into apertures 40, 42, 44.

Figure 5:
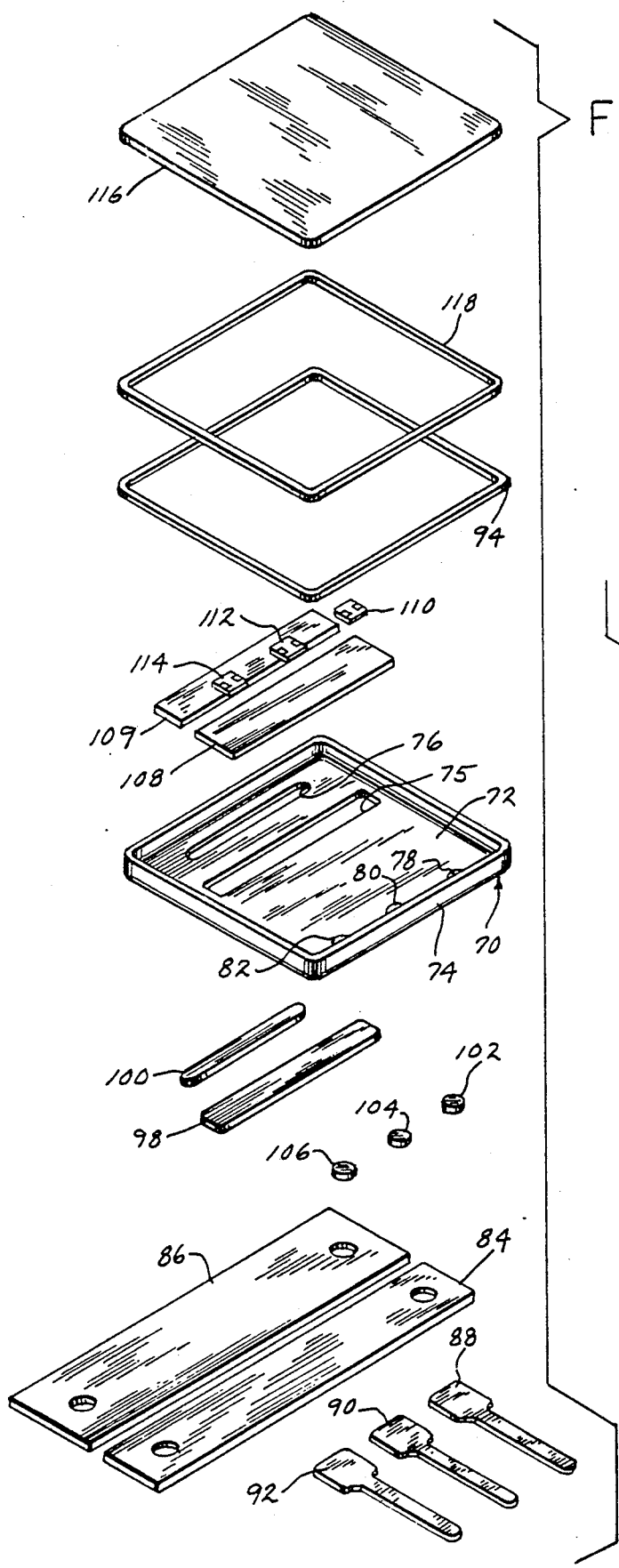
FIG. 5 is an exploded perspective view of an alternate embodiment of an electric circuit assembly in accordance with the invention of the parent application.
Figure 8:
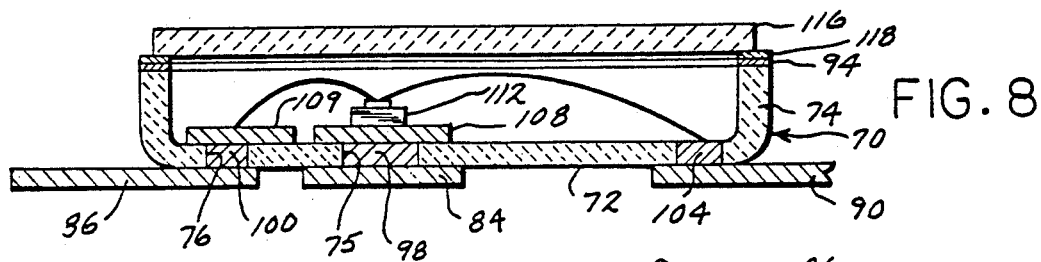
FIG. 8 is a sectional view of the assembled structure of FIG. 5.

FIGS. 5 and 8 show a further embodiment. Ceramic tub 70 has a floor 72 and an integral side wall 74 around the perimeter thereof and extending upwardly therefrom. Floor 72 has a pair of oblong extended apertures 75 and 76 therethrough and a plurality of gate lead apertures 78, 80, 82 therethrough. The bottom of floor 72 is directly bonded to a pair of flat copper conductive lead frames 84, 86, and gate lead frames 88, 90, 92, therebelow. Copper ring 94 is directly bonded on the top 96 of side wall 74. Lead frames 84, 86, 88, 90, 92 have respective portions 98, 100, 102, 104, 106 extending upwardly in respective apertures 75, 76, 78, 80, 82. A further lead frame portion 108 is provided over aperture 75 on lead frame portion 98 to provide a wider drain contact attachment area for the lower drain contacts of FET chips 110, 112, 114. A further lead frame portion 109 is provided over aperture 76 on lead frame portion 100 to provide a wider contact attachment area for the source lead wires from the FET chips. The FET chips are connected in parallel on portion 108 on portion 98 of drain lead frame 84, with respective jumper wires connected in parallel to portion 109 on portion 100 of source lead frame 86, and with respective gate jumper wires connected to respective portions 102, 104, 106 of gate lead frames 88, 90, 82. Lead frame portion 98 of lead frame 84 is formed by half-etching as noted above, or is a separate piece soldered or welded to lead frame 84 and/or directly bonded to the sides of aperture 75. The remaining lead frame portions are comparably provided. Lead frame portions 108 and 109 are soldered or welded on respective lead frame portions 98 and 100 after the direct bond step, or are placed on respective lead frame portions 98 and 100 over respective apertures 75 and 76 and directly bonded to the top of floor 72. Ceramic top cover 116 has copper ring 118 directly bonded to the underside thereof. Rings 94 and 118 are welded to each other to hermetically seal top cover 116 to tub 70.

Figure 6:
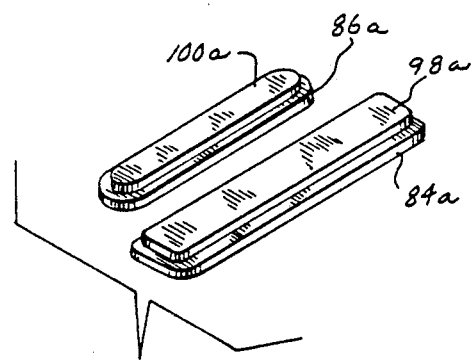
FIG. 6 is a perspective view of an alternate embodiment of a portion of the structure of FIG. 5.

FIG. 6 shows modified lead frames 84a and 86a corresponding respectively to lead frames 84 and 86, and with portions 98a and 100a extending upwardly therefrom and corresponding to portions 98 and 100.

Figure 7:
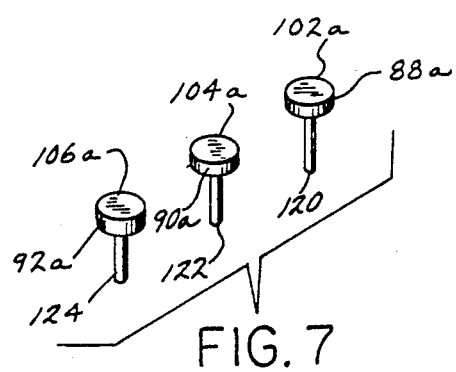
FIG. 7 is a perspective view of an alternate embodiment of a portion of the structure of FIG. 5.

FIG. 7 shows modified gate lead frames 88a, 90a, 92a, corresponding respectively to gate lead frames 88, 90, 92. Gate lead frames 88a, 90a, 92a, have upper head portions 102a, 104a, 106a corresponding respectively to portions 102, 104, 106, and which are received in respective apertures 78, 80, 82, of the floor 72 of tub 70 and directly bonded thereto. Gate lead frames 88a, 90a, 92a, have lower stems 120, 122, 124 extending downwardly therefrom below floor 72 of tub 70.

Figure 9:
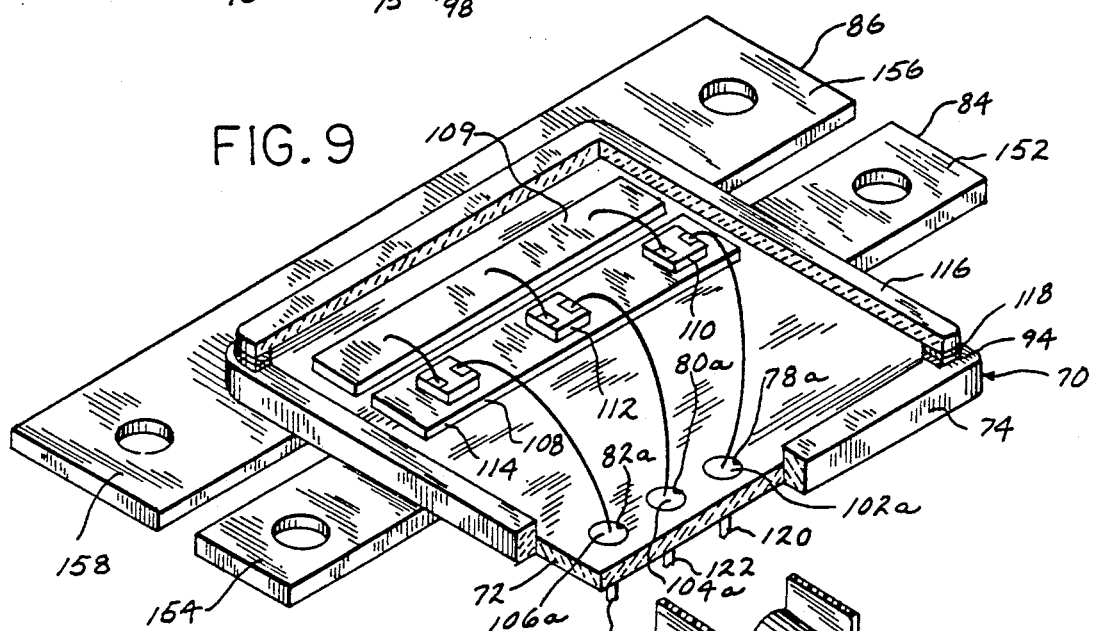
FIG. 9 is a perspective assembled view of structure similar to FIG. 5 and with further modifications.

FIG. 9 shows an assembled view of the structure of FIG. 5, but modified to incorporate the gate lead frames of FIG. 7, and with gate lead frame apertures 78a, 80a, 82a, moved to one side of the tub. For clarity of illustration, simple gating circuitry is shown, though it is within the scope of the invention to include further control gating circuitry within the tub as desired for particular implementations. FIG. 9 shows a single tub 70 which forms the basic building block for multi-tub structure of FIG. 10.

Figure 10:
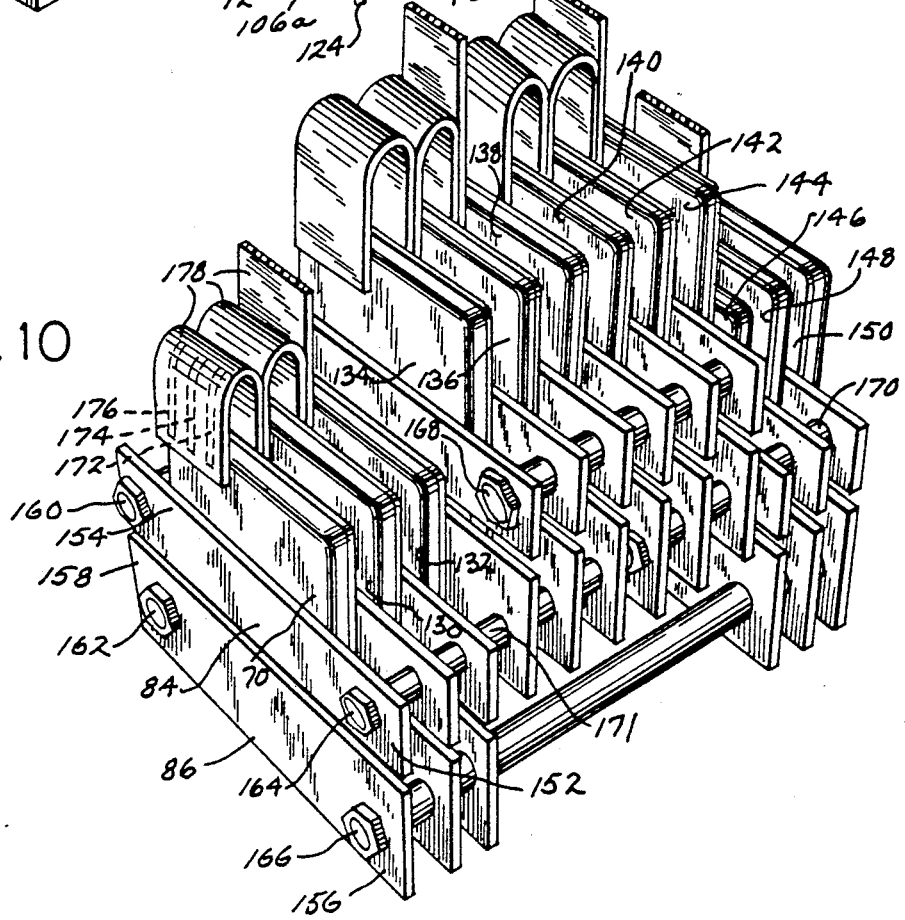
FIG. 10 is a perspective view of a further electric circuit assembly in accordance with the invention of the parent application.

FIG. 10 shows a plurality of ceramic tubs 70, 130, 132, 134, 136, 138, 140, 142, 144, 146, 148, 150, stacked on top of each other. Each tub has a floor and an integral side wall around the perimeter thereof and extending upwardly therefrom. Each tub has a pair of flat copper conductor lead frames comparable to lead frames 84 and 86 directly and hermetically bonded thereto as above described. Each tub has a top cover comparable to cover 116 hermetically sealed to the top of the side wall of the tub to close the latter and hermetically seal the respective semiconductor chips.

Lead frame 84 has distal end portions 152 and 154 extending laterally oppositely beyond opposite distal sides of tub 70. Lead frame 86 has distal end portions 156 and 158 extending laterally oppositely beyond the opposite distal sides of tub 70. The other comparable lead frames of the other tubs likewise have distal ends extending laterally oppositely beyond the opposite distal sides of the respective tubs. The tubs are held together in stacked relation by mounting bolts, some of which are seen at 160, 162, 164, 166, 168, 170. The mounting bolts engage the lead frames at the laterally extended distal end portions. The mounting bolts engage the lead frames at the laterally extended distal end portions. The mounting bolts extend upwardly along the stack and perpendicularly to the flat lead frames and extend through apertures in the distal ends of the lead frames. The bolts also extend through hollow cylindrical spacers 171 between the lead frames and which has a length about equal to the height of a tub and cover and which space the ends of the lead frames accordingly. The bolts clamp the lead frames and spacers into mechanical and electrical contact. The lead frames are also spaced by the tubs and covers therebetween. The tubs sit on the central portions of the respective lead frames with the bottom of the floor of each tub bonded to the top of the respective pair of lead frames. The tubs are spaced by the lead frames therebetween. Additional spacers may be provided between the tub cover and the next lead frame thereabove, with accordingly longer spacers at the ends of the lead frames, if a larger gap is desired for cooling purposes, e.g. for air or liquid flow therethrough. Gate lead frame stems such as 120, 122, 124, are connected to respective conductor strip patterns 172, 174, 176, on an insulating film 178. The particular electrical contact connection pattern in FIG. 9 is an H-bridge with each tub having three semiconductor switches connected in parallel and in parallel with the three chips in each of two other tubs. Gating strip 178 and its conductive strips are connected to the gate lead frame stems for tubs 70, 130 and 132. Tubs 70, 130 and 132 provide one leg of the H-bridge. A second leg of the H-bridge is provided by tubs 134, 136, 138. A third leg of H-bridge is provided by tubs 140, 142, 144. The fourth leg of the H-bridge is provided by tubs 146, 148, 150. Bolts 166 and 168 are connected to the load. Bolts 164 and 170 are connected to the AC source. Other stacked structures may of course be constructed. Each tub and cover is an individual hermetic package. The packages are mechanically supported and electrically connected by the bolts and spacers.

Present Invention

FIGS. 11-16 show an electric circuit assembly 212. An electrically insulating refractory ceramic tub 214 has a substrate floor 216, FIG. 12, and an integral side wall 218 around the perimeter thereof and extending upwardly therefrom. Tub 214 is placed in contact with electrically conductive copper lead frames 220, 222, 224 therebelow, which in turn are placed in contact with electrically insulating refractory ceramic substrate 226 therebelow, which in turn is placed in contact with electrically conductive copper base plate 228 therebelow. A copper ring 230 is placed in contact with the top 232 of side wall 218 of tub 214. A second copper ring 234 is placed in contact with the underside of an electrically insulating refractory ceramic top cover 236.

The assemblies are then directly and hermetically bonded. Copper ring 230, ceramic tub 214, copper lead frames 220, 222, 224, ceramic substrate 226, and copper base plate 228 are placed in the noted contact and heated to a temperature below the melting point of copper ring 230, copper lead frames 220, 222, 224, and copper base plate 228 to form a eutectic with the copper which wets such copper members and the noted ceramic members in contact therewith. The assembly is then cooled, with copper ring 230 bonded to the top 232 of side wall 218 of tub 214 therebelow, and with lead frames 220, 222, 224 bonded to the bottom of substrate floor 216 of tub 214 thereabove, and with lead frames 220, 222, 224 bonded to the top of ceramic substrate 226 therebelow, and with copper base plate 228 bonded to the bottom of ceramic substrate 226 thereabove. The copper members are pre-oxidized, and the assembly is heated in an inert atmosphere, or alternately the assembly is heated in a reactive oxidation atmosphere. Copper ring 234 is directly and hermetically bonded to the underside of ceramic top cover 236 in like manner. An electrical component provided by semiconductor chip 238 is then mounted in the tub and connected to the lead frames. The top cover 236 is hermetically sealed to the top of the side wall of the tub, by welding rings 230 and 234 to each other.

Substrate floor 216 has a plurality of apertures 240, 242, 244, therethrough. Semiconductor chip 238 is connected to the lead frames through the apertures. Lead frame 220 has a portion 246 extending upwardly in aperture 240. Portion 246 may be formed by half-etching lead frame 220, for example as shown in U.S. Pat. No. 4,630,174, or portion 246 may be soldered or welded to lead frame 220, and/or directly bonded to the sides of aperture 240. Semiconductor chip 238 has a lower contact pad 248 mounted on portion 246 by solder reflow and in electrical contact with portion 246. Lead frames 222 and 224 have portions 250 and 252, FIGS. 11, 12 and 15, extending upwardly in respective apertures 242 and 244 which likewise may be formed by half-etching, or may be separate pieces welded or soldered to the rest of the lead frame therebelow and/or directly bonded to the sides of the apertures. Semiconductor chip 238 has a pair of upper contact pads 254 and 256, FIG. 12, connected by sonically or thermally welded respective jumper leads 258 and 260 to respective lead frame portions 250 and 252 as in the parent application, or to respective terminal connection pads 262 and 264 sonically or thermally welded or directly bonded on respective portions 250 and 252. In the case of a FET chip, lower contact pad 248 is the drain, and upper contact pads 254 and 256 are the source and gate.

Tub 214 has a lower configured multi-partitioned integral wall 270 extending downwardly from the underside 272 of substrate floor 216. The bottom 273 of wall 270 engages the top side 275 of lower substrate 226 and is sealed thereto by electrically insulating sealing material. The multi-partitioned wall 270 defines recesses 274, 276, 278 in the lower surface of the tub below respective apertures 240, 242, 244. Each lead frame has a respective pad portion 220a, 222a, 224a in a respective recess 274, 276, 278. Each lead frame has a respective extension portion 220b, 222b, 224b extending laterally beyond substrates 216 and 226 through a respective slot 280, 282, 284 in wall 270. Wall 270 includes a dividing wall portion 286 between lead frames 220 and 222, and a dividing wall portion 288 between lead frames 220 and 224, which dividing wall portions provide electrical isolation and prevent sparking or voltage crossover between respective lead frames.

Multi-partitioned wall 270 includes an outer peripheral portion 290 generally defining a chamber and generally enclosing the space between substrates 216 and 226 and encompassing recesses 274, 276, 278. Dividing wall portions 286 and 288 are part of inner wall portions dividing the chamber into compartments defining the recesses and receiving respective lead frames. Recess 274 is separated from recess 276 by a first L-shaped dividing wall having a first leg 292 between pad portion 220a of lead frame 220 and pad portion 222a of lead frame 222, and having a second leg provided by above noted dividing wall portion 286 between extension portion 220b of lead frame 220 and pad portion 222a of lead frame 222. Recess 278 is separated from recess 274 by a second L-shaped dividing wall having a first leg 294 between pad portion 224a of lead frame 224 and pad portion 220a of lead frame 220, and having a second leg provided by above noted dividing wall portion 288 between pad portion 224a of lead frame 224 and extension portion 220b of lead frame 220. Pad portions 222a and 224a are spaced and separated by extension portion 220b and dividing wall portions 286 and 288 extending therebetween. The height of wall 270, the depth of recesses 274, 276, 278, and the height of lead frames 220, 222, 224, are all substantially the same such that the bottom 273 of tub 214 is substantially flush with the bottom of the lead frames. The lead frames engage both the underside 272 of substrate 216 and the top side 274 of substrate 226.

The invention may be practiced with or without hermetic sealing, i.e. with or without upper side wall 218 of the tub, top cover 236, etc. The space between substrates 216 and 226 is not sealed because of the passage of extension portions 220b, 222b, 224b of the lead frames through respective slots 280, 282, 284 in the outer peripheral portion 290 of wall 270. The space between substrates 216 and 226 may be sealed if desired by sealing the interface between the lead frame extensions and respective slots 280, 282, 284, for example by providing electrically insulating sealing material at such interface, or by sealing same during the above noted direct bond process by directly bonding the lead frame extensions to the ceramic material of wall 270 of the tub. In a further alternative, the circuit assembly may be provided to the user as shown in FIG. 13, without substrate 226 and base plate 228.

It is recognized that various equivalents, alternatives and modifications are possible within the scope of the appended claims.

I claim:

1. An electric circuit assembly comprising:
   an electrically insulating substrate having a plurality of apertures therethrough, and having a lower surface with a plurality of recesses therein below respective said apertures;
   a plurality of electrically conductive lead frames in respective said recesses;
   an electrical component connected to said lead frames through said apertures.

2. The invention according to claim 1 wherein said substrate includes one or more portions extending downwardly between said recesses and defining a dividing wall therebetween.

3. The invention according to claim 2 wherein said substrate includes an outer peripheral portion extending downwardly and defining an outer wall encompassing said recesses.

4. The invention according to claim 3 wherein said dividing wall is integral with said outer wall.

5. The invention according to claim 4 wherein said outer wall has a plurality of slots therein, and wherein said lead frames extend laterally beyond said outer wall through respective said slots.

6. The invention according to claim 5 comprising three said lead frames each having an extension portion extending parallel to each other and beyond said outer wall through a respective said slot, a first said lead frame having a pad portion in a first said recess, a second said lead frame having a pad portion in a second said recess, and a third said lead frame having a pad portion in a third said recess, wherein said pad portions of said second and third lead frames are spaced and separated by said extension portion of said first lead frame extending therebetween.

7. The invention according to claim 6 wherein said first recess is separated from said second recess by a first L-shaped said dividing wall having a first leg between said pad portion of said first lead frame and said pad portion of said second lead frame and having a second leg between said extension portion of said first lead frame and said pad portion of said second lead frame and wherein said third recess is separated from said first recess by a second L-shaped said dividing wall having a first leg between said pad portion of said third lead frame and said pad portion of said first lead frame and having a second leg between said pad portion of said third lead frame and said extension portion of said first lead frame.

8. The invention according to claim 1 wherein the depth of said recesses is substantially the same as the height of said lead frames such that the bottom of said substrate is substantially flush with the bottom of said lead frames.

9. An electric circuit assembly comprising:
   an electrically insulating substrate having a plurality of apertures therethrough, and having an outer periphery extending downwardly and defining an outer wall extending downwardly beyond and encompassing the central underside of said substrate;
   a plurality of lead frames engaging said central underside of said substrate;
   an electrical component connected to said lead frames through said apertures.

10. The invention according to claim 9 wherein the extension of said outer wall beyond said central underside is substantially the same as the height of said lead frames such that the bottom of said outer wall and the bottom of said lead frames are substantially flush.

11. The invention according to claim 9 wherein said outer wall has a plurality of slots therein, and wherein said lead frames extend laterally beyond said outer wall through respective said slots.

12. An electric circuit assembly comprising:
   a first electrically insulating substrate having a plurality of apertures therethrough;
   a second electrically insulating substrate;
   an electrically insulating outer peripheral wall extending between said substrates and spacing said first substrate above said second substrate and encompassing the space therebetween;
   a plurality of electrically conductive lead frames in said space between said first and second substrates;
   an electrical component in one of said apertures and contracting one of said lead frames therebelow and connected by lead wires to other of said lead frames through other of said apertures.

13. The invention according to claim 12 wherein said lead frames engage both the underside of said first substrate and the top side of said second substrate.

14. The invention according to claim 13 wherein said lead frames and said outer wall have substantially the same height.

15. The invention according to claim 12 wherein said outer wall is integral with one of said first and second substrates and is mounted and sealed to the other of said first and second substrates with electrically insulating sealing material.

16. The invention according to claim 12 wherein said lead frames extend laterally through and beyond said outer wall, said outer wall extending generally vertically between said first and second substrates and defining a chamber sealing the space between said first and second substrates except at said lead frames where said lead frames extend externally of said chamber through said outer wall.

17. The invention according to claim 16 comprising sealing material sealing the interface of said lead frames and said outer wall to seal said chamber.

18. An electric circuit assembly comprising:
   a first electrically insulating substrate having a plurality of apertures therethrough;
   a second electrically insulating substrate;
   an electrically insulating wall extending between said substrates and spacing said first substrate above said second substrate;
   a plurality of electrically conductive lead frames including at least two lead frames in the space between said first and second substrates;
   said wall having a dividing portion extending between and separating said two lead frames and providing electrical isolation and preventing sparking or voltage crossover between said two lead frames;

an electrical component in one of said apertures and contacting one of said lead frames therebelow and connected by lead wires to other of said lead frames through other of said apertures.

19. The invention according to claim 18 wherein said lead frames engage both the underside of said first substrate and the top side of said second substrate.

20. The invention according to claim 19 wherein said lead frames and said wall have substantially the same height.

21. The invention according to claim 18 wherein said wall is integral with one of said first and second substrates and is mounted and sealed to the other of said first and second substrates with electrically insulating sealing material.

22. The invention according to claim 21 wherein said wall comprises an outer peripheral portion generally defining a chamber and generally enclosing the space between said first and second substrates, and wherein said wall further comprises an inner portion dividing said chamber into compartments receiving respective said lead frames.

23. The invention according to claim 18 wherein said wall comprises an outer peripheral portion through which said lead frames extend.

24. The invention according to claim 23 wherein said outer wall portion extends between said first and second substrates and generally defines a chamber generally enclosing the space between said first and second substrates, and wherein said wall comprises an inner wall portion extending between said first and second substrates and providing said electrical isolation between said two lead frames.

25. The invention according to claim 24 comprising sealing material sealing the interface of said lead frames and said outer wall portion to seal said chamber.

26. An electric circuit assembly comprising:
an electrically insulating refractory tub having a floor with a plurality of aperture therethrough and an integral side wall around the perimeter thereof and extending upwardly therefrom;
electrically conductive metallic lead frames directly and hermetically bonded to the underside of said floor of said tub by placing said lead frames in contact with said tub, heating said lead frames and said tub to a temperature below the melting point of said lead frames to form a eutectic with said lead frames which wets said lead frames and said tub, and cooling said lead frames and said tub, with said lead frames bonded to said tub;
an electrical component in said tub connected to said lead frames through said apertures;
a top cover hermetically sealed to the top of said side wall to close said tub and hermetically seal said electrical component therein;
a lower electrically insulating substrate;
an electrically insulating lower wall extending between and spacing said lower substrate and said floor of said tub, at least two of said lead frames being in the space between said lower substrate and said floor of said tub,
said wall having a dividing portion extending between and separating said two lead frames and providing electrical isolation and preventing sparking or voltage crossover between said two lead frames.

27. The invention according to claim 26 wherein said lead frames engage both the top side of said lower substrate and the underside of said floor of said tub.

28. The invention according to claim 27 wherein said lead frames and said lower wall have substantially the same height.

29. The invention according to claim 26 wherein said lower wall is integral with one of said tub and said lower substrate and is mounted and sealed to the other of said tub and said lower substrate with electrically insulating sealing material.

30. The invention according to claim 29 wherein said lower wall comprises an outer peripheral portion generally defining a chamber and generally enclosing the space between said floor of said tub and said lower substrate, and wherein said lower wall further comprises an inner portion dividing said chamber into compartments receiving respective said lead frames.

31. An electric circuit assembly comprising:
an electrically insulating refractory tub having a floor with a plurality of apertures therethrough and having an underside with a plurality of recesses therein below respective said apertures and having an integral side wall around the perimeter thereof and extending upwardly therefrom;
electrically conductive metallic lead frames directly and hermetically bonded to said underside of said floor of said tub in respective said recesses by placing said lead frames in contact with said underside of said floor of said tub in said recesses, heating said lead frames and said tub to a temperature below the melting point of said lead frames to form a eutectic with said lead frames which wets said lead frames and said tub, and cooling said lead frames and said tub, with said lead frames bonded to said underside of said floor of said tub in said recesses;
an electrical component in said tub connected to said lead frames through said apertures;
a top cover hermetically sealed to the top of said side wall to close said tub and hermetically seal said electrical component therein, wherein said cover is an electrically insulating refractory member;
a first metallic ring directly and hermetically bonded to the top of said side wall of said tub by placing said first ring in contact with said top of said side wall, heating said ring and said tub to a temperature below the melting point of said ring to form a eutectic with said ring which wets said ring and said top of said side wall of said tub, and cooling said ring and said tub, with said ring bonded to said top of said side wall of said tub;
a second metallic ring directly and hermetically bonded to said top cover by placing said second ring in contact with said top cover, heating said second ring and said top cover to a temperature below the melting point of said second ring to form a eutectic with said second ring which wets said second ring and said top cover, and cooling said second ring and said top cover, with said second ring bonded to said top cover;
and wherein said rings are welded to each other.

* * * * *